US008585187B2

(12) United States Patent
Nystrom et al.

(10) Patent No.: US 8,585,187 B2
(45) Date of Patent: Nov. 19, 2013

(54) HIGH DENSITY ELECTRICAL INTERCONNECT FOR PRINTING DEVICES USING FLEX CIRCUITS AND DIELECTRIC UNDERFILL

(75) Inventors: Peter J. Nystrom, Webster, NY (US); Gary D. Redding, Victor, NY (US); Mark A. Cellura, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 124 days.

(21) Appl. No.: 13/097,182

(22) Filed: Apr. 29, 2011

(65) Prior Publication Data

US 2012/0274708 A1 Nov. 1, 2012

(51) Int. Cl.
*B41J 2/045* (2006.01)
*H01L 41/22* (2013.01)

(52) U.S. Cl.
USPC .......... 347/70; 29/25.35

(58) Field of Classification Search
USPC .......... 347/70; 29/25.35
See application file for complete search history.

(56) References Cited

U.S. PATENT DOCUMENTS 6,109,736 A * 8/2000 Miyata et al. .......... 347/68
7,560,308 B2 * 7/2009 Banno et al. .......... 438/118
2003/0112298 A1 * 6/2003 Sato et al. .......... 347/68

OTHER PUBLICATIONS

Wikipedia, the free encyclopedia, Adhesive, last modified Mar. 3, 2013, 1st Paragraph.*
Wikipedia, the free encyclopedia, Asperity, last modified Jan. 13, 2012, 1st Paragraph.*
The free dictionary online, Dielectric Materials, Jan. 1, 2002, McGraw-Hill Companies Inc, McGraw-Hill Concise Encyclopedia of Engineering—2nd Paragraph.*
Dolan et al., "Polymer Layer Removal on PZT Arrays using a Plasma Etch", U.S. Appl. No. 13/011,409, filed Jan. 21, 2011.
Stephens et al., "Electrical Interconnect Using Embossed Contacts on a Flex Circuit"; U.S. Appl. No. 12/795,605, filed Jun. 7, 2010.

* cited by examiner

*Primary Examiner* — Lisa M Solomon
(74) *Attorney, Agent, or Firm* — MH2 Technology Law Group LLP

(57) ABSTRACT

A method for forming an ink jet print head can include attaching a plurality of piezoelectric elements to a diaphragm of a jet stack subassembly, electrically attaching a flex circuit to the plurality of piezoelectric elements, then dispensing an dielectric underfill between the flex circuit and the jet stack subassembly. The use of an underfill after attachment of the flex circuit eliminates the need for the patterned removal of an interstitial material from the tops of the piezoelectric elements, and removes the requirement for a patterned standoff layer. In an embodiment, electrical contact between the flex circuit and the piezoelectric elements is established through physical contact between bump electrodes of the flex circuit and the piezoelectric elements, without the use of a separate conductor, thereby eliminating the possibility of electrical shorts caused by misapplication of a conductor.

15 Claims, 11 Drawing Sheets

| 1 | 10 | 19 | 28 | 37 | 46 | 55 | 64 | 73 | 82 | 91 | 100 | 109 | 118 |
|---|---|---|---|---|---|---|---|---|---|---|---|---|---|
| 7 | 7 | 7 | 7 | 7 | 6 | 7 | 5 | 5 | 5 | 5 | 5 | 5 | 5 |
| 10 | 7 | 7 | 7 | 7 | 7 | 6 | 5 | 5 | 5 | 5 | 5 | 5 | 5 |
| 7 | 7 | 7 | 7 | 7 | 7 | 6 | 5 | 5 | 5 | 5 | 5 | 5 | 5 |
| 7 | 7 | 7 | 7 | 7 | 7 | 6 | 5 | 5 | 5 | 5 | 5 | 5 | 5 |
| 7 | 7 | 7 | 7 | 7 | 7 | 6 | 6 | 5 | 5 | 5 | 5 | 5 | 5 |
| 7 | 7 | 7 | 7 | 7 | 7 | 7 | 5 | 5 | 5 | 5 | 5 | 5 | 5 |
| 7 | 7 | 7 | 7 | 7 | 7 | 7 | 5 | 5 | 5 | 5 | 5 | 5 | 5 |
| 8 | 7 | 7 | 7 | 7 | 7 | 7 | 5 | 5 | 5 | 5 | 5 | 5 | 5 |
| 8 | 8 | 7 | 7 | 7 | 7 | 7 | 5 | 5 | 5 | 5 | 5 | 5 | 5 |

FIG. 18A

| 1 | 10 | 19 | 28 | 37 | 46 | 55 | 64 | 73 | 82 | 91 | 100 | 109 | 118 |
|---|---|---|---|---|---|---|---|---|---|---|---|---|---|
| 7 | 7 | 7 | 7 | 7 | 6 | 7 | 5 | 5 | 5 | 5 | 5 | 5 | 5 |
| 10 | 7 | 7 | 7 | 7 | 7 | 6 | 5 | 5 | 5 | 5 | 5 | 5 | 5 |
| 7 | 7 | 7 | 7 | 7 | 7 | 6 | 5 | 5 | 5 | 5 | 5 | 5 | 5 |
| 7 | 7 | 7 | 7 | 7 | 7 | 6 | 5 | 5 | 5 | 5 | 5 | 5 | 5 |
| 7 | 7 | 7 | 7 | 7 | 7 | 6 | 6 | 5 | 5 | 5 | 5 | 5 | 5 |
| 7 | 7 | 7 | 7 | 7 | 7 | 7 | 5 | 5 | 5 | 5 | 5 | 5 | 5 |
| 8 | 7 | 7 | 7 | 7 | 7 | 7 | 5 | 5 | 5 | 5 | 5 | 5 | 5 |
| 8 | 7 | 7 | 7 | 7 | 7 | 7 | 5 | 5 | 5 | 5 | 5 | 5 | 5 |
| 8 | 8 | 7 | 7 | 7 | 7 | 7 | 5 | 5 | 5 | 5 | 5 | 5 | 5 |

FIG. 18B

HIGH DENSITY ELECTRICAL INTERCONNECT FOR PRINTING DEVICES USING FLEX CIRCUITS AND DIELECTRIC UNDERFILL

FIELD OF THE INVENTION

The present teachings relate to the field of ink jet printing devices and, more particularly, to a high density piezoelectric ink jet print head and methods of making a high density piezoelectric ink jet print head and a printer including a high density piezoelectric ink jet print head.

BACKGROUND OF THE INVENTION

Drop on demand ink jet technology is widely used in the printing industry. Printers using drop on demand ink jet technology can use either thermal ink jet technology or piezoelectric technology. Even though they are more expensive to manufacture than thermal ink jets, piezoelectric ink jets are generally favored as they can use a wider variety of inks and eliminate problems with kogation.

Piezoelectric ink jet print heads typically include a flexible diaphragm and an array of piezoelectric elements (transducers) attached to the diaphragm. When a voltage is applied to a piezoelectric element, typically through electrical connection with an electrode electrically coupled to a voltage source, the piezoelectric element bends or deflects, causing the diaphragm to flex which expels a quantity of ink from a chamber through a nozzle. The flexing further draws ink into the chamber from a main ink reservoir through an opening to replace the expelled ink.

Increasing the printing resolution of an ink jet printer employing piezoelectric ink jet technology is a goal of design engineers. Increasing the jet density of the piezoelectric ink jet print head can increase printing resolution. One way to increase the jet density is to eliminate manifolds which are internal to a jet stack. With this design, it is preferable to have a single port through the back of the jet stack for each jet. The port functions as a pathway for the transfer of ink from the reservoir to each jet chamber. Because of the large number of jets in a high density print head, the large number of ports, one for each jet, must pass vertically through the diaphragm and between the piezoelectric elements.

Processes for forming a jet stack can include the formation of an interstitial layer between each piezoelectric element and, in some processes, over the top of each piezoelectric element. If the interstitial layer is dispensed over the top of the each piezoelectric element, it is removed to expose the conductive piezoelectric element. Next, a patterned standoff layer having openings therein can be applied to the interstitial layer, where the openings expose the top of each piezoelectric element. A quantity (i.e., a microdrop) of conductor such as conductive epoxy, conductive paste, or another conductive material is dispensed individually on the top of each piezoelectric element. Electrodes of a flexible printed circuit (i.e., a flex circuit) or a printed circuit board (PCB) are placed in contact with each microdrop to facilitate electrically communication between each piezoelectric element and the electrodes of the flex circuit or PCB. The standoff layer functions to contain the flow of the conductive microdrops to the desired locations on top of the piezoelectric elements, and also functions as an adhesive between the interstitial layer and the flex circuit or PCB.

Manufacturing a high density ink jet print head assembly having an external manifold has required new processing methods. As resolution and density of the print heads increase, the area available to provide electrical interconnects decreases. Routing of other functions within the head, such as ink feed structures, compete for this reduced space and place restrictions on the types of materials used. Methods for manufacturing a print head having electrical contacts which are easier to manufacture than prior structures, and the resulting print head, would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

In an embodiment of the present teachings, a method for forming an ink jet print head includes attaching a piezoelectric element array comprising a plurality of piezoelectric elements to a diaphragm, electrically coupling a plurality of electrically conductive flexible printed circuit electrodes of a flexible printed circuit to the plurality of electrically conductive piezoelectric elements to form at least one space between the diaphragm and the flexible printed circuit, dispensing a liquid underfill into the at least one space between the diaphragm and the flexible printed circuit, and curing the liquid underfill to encapsulate the plurality of piezoelectric elements within the underfill.

In another embodiment of the present teachings, a print head for an ink jet printer can include a diaphragm having a plurality of openings therein, a plurality of piezoelectric elements attached to the diaphragm, a flexible printed circuit having a plurality of electrodes each formed into a conductive bump electrode, wherein the plurality of electrodes are electrically attached to the plurality of piezoelectric elements, and a dielectric underfill between the flexible printed circuit and the diaphragm.

In another embodiment of the present teachings, an ink jet printer can include a print head having a diaphragm having a plurality of openings therein, a plurality of piezoelectric elements attached to the diaphragm, a flexible printed circuit having a plurality of electrodes each formed into a conductive bump electrode, wherein the plurality of electrodes are electrically attached to the plurality of piezoelectric elements, and a dielectric underfill between the flexible printed circuit and the diaphragm. The printer can further include a manifold attached to the flexible printed circuit and an ink reservoir formed in part by a surface of the manifold, wherein the print head is adapted to operate in accordance with digital instructions to create a desired image on a print medium.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures:

FIGS. 18A and 18B are tables showing measured resistance between a plurality of bump electrodes and a plurality of piezoelectric elements formed according to an embodiment of the present teachings.

Figure 1:
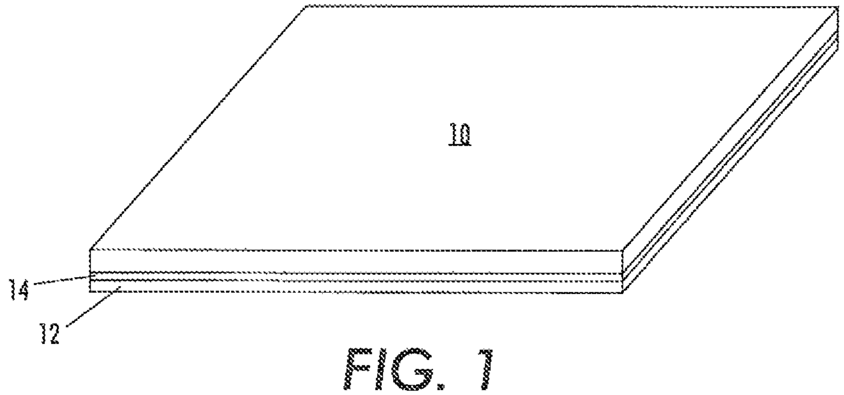
FIGS. 1 and 2 are perspective views of intermediate piezoelectric elements of an in-process device in accordance with an embodiment of the present teachings.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to embodiments of the present teachings, an example of which is illustrated in the accompanying drawings. Wherever possible, the same reference numbers will be used throughout the drawings to refer to the same or like parts.

As used herein, the word "printer" encompasses any apparatus that performs a print outputting function for any purpose, such as a digital copier, bookmaking machine, facsimile machine, a multi-function machine, etc. The word "polymer" encompasses any one of a broad range of carbon-based compounds formed from long-chain molecules including thermoset polyimides, thermoplastics, resins, polycarbonates, epoxies, and related compounds known to the art.

With conventional processes for forming jet stacks such as those discussed above, the material costs relating to the conductor tend to be high. For example, the conductor itself is filled with silver or other precious metals and is expensive. Further, the use of a laser patterned adhesive standoff layer which contains the flow of the conductor to the desired location also adds to the cost of the device. Additionally, the amount of conductor must be carefully controlled, because too little conductor can result in electrical opens and a non-functional transducer, while excessive conductor can result in overfill and electrical shorts between adjacent transducers. Further, the conductor can be forced under the standoff layer during attachment of a printed circuit board or flexible printed circuit, which can result in electrical shorts and malfunctioning devices. Processing errors can result in rework to salvage the device, but rework is difficult due to the high density layout of the transducer array and the inability to access the piezoelectric elements due to the overlying flex circuit or printed circuit board (PCB). Also, the standoff layer must be accurately aligned to the transducer array to properly expose the top of the each piezoelectric element, and misalignment errors can occur. These problems will accelerate with increasing density of the transducer array.

The formation and use of a print head is discussed in U.S. patent Ser. No. 13/011,409, titled "Polymer Layer Removal on PZT Arrays Using A Plasma Etch," filed Jan. 21, 2011, which is incorporated herein by reference in its entirety.

Embodiments of the present teachings can simplify the manufacture of a jet stack for a print head, which can be used as part of a printer. Further, the present teachings can result in simplified connection to a transducer array, particularly as transducer arrays continue to become more dense in order to increase print resolution. The present teachings can include the use of a flexible printed circuit (i.e., a "flex circuit") with a plurality of conductive elements (flex circuit electrodes, conductive bump electrodes) which electrically couple circuit traces within the flex circuit to the plurality of piezoelectric elements formed as part of a jet stack subassembly. In an embodiment, electrical communication between the conductive elements of the flex circuit and the piezoelectric elements can be established through a conductive material placed either on the conductive elements of the flex circuit or the piezoelectric elements, or both. In another embodiment, electrical communication is established through a physical connection between the plurality of conductive bump electrodes and the plurality of piezoelectric elements, where the connection does not require any additional conductive material. After attaching the flex circuit, a liquid underfill can be applied between the flex circuit and the jet stack subassembly. Because the present teachings do not require the use of a conventional interstitial layer or a standoff layer, the aforementioned problems associated with the interstitial layer and the standoff layer, and connection of the flex circuit electrodes to the piezoelectric elements, are avoided. Additionally, the process for forming the jet stack as discussed herein can be more easily scaled with continued miniaturization of transducer arrays than some conventional processes.

An embodiment of the present teachings can include the formation of a jet stack, a print head, and a printer including the print head. In the perspective view of FIG. 1, a piezoelectric element layer 10 is detachably bonded to a transfer carrier 12 with an adhesive 14. The piezoelectric element layer 10 can include, for example, a lead-zirconate-titanate layer, for example between about 25 μm to about 150 μm thick to function as an inner dielectric. The piezoelectric element layer 10 can be plated on both sides with nickel, for example, using an electroless plating process to provide conductive layers on each side of the dielectric PZT. The nickel-plated PZT functions essentially as a parallel plate capacitor which develops a difference in voltage potential across the inner PZT material. The carrier 12 can include a metal sheet, a plastic sheet, or another transfer carrier. The adhesive layer 14 which attaches the piezoelectric element layer 10 to the transfer carrier 12 can include a dicing tape, thermoplastic, or another adhesive. In another embodiment, the transfer carrier 12 can be a material such as a self-adhesive thermoplastic layer such that a separate adhesive layer 14 is not required.

Figure 2:
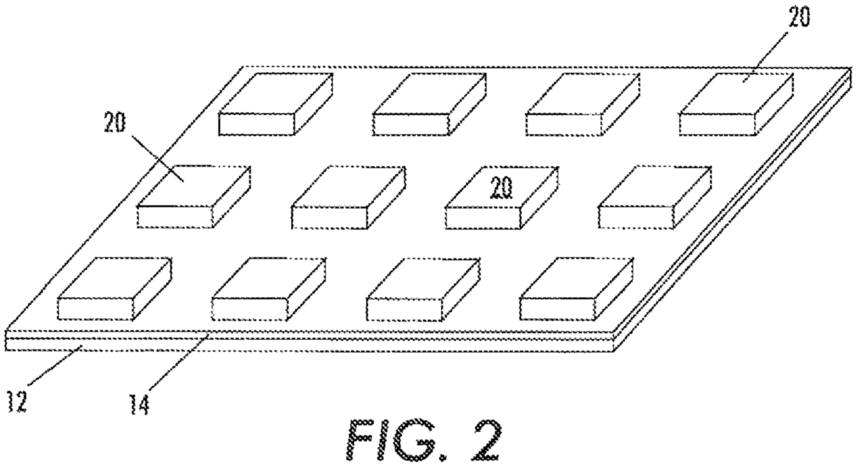

After forming the FIG. 1 structure, the piezoelectric element layer 10 is diced to form a plurality of individual piezoelectric elements 20 as depicted in FIG. 2. It will be appreciated that while FIG. 2 depicts 4×3 array of piezoelectric elements, a larger array can be formed. For example, current print heads can have a 344×20 array of piezoelectric elements. The dicing can be performed using mechanical techniques such as with a saw such as a wafer dicing saw, using a dry etching process, using a laser ablation process, etc. To ensure complete separation of each adjacent piezoelectric element 20, the dicing process can terminate after removing a portion of the adhesive 14 and stopping on the transfer carrier 12, or after dicing through the adhesive 14 and part way into the carrier 12.

Figure 3:
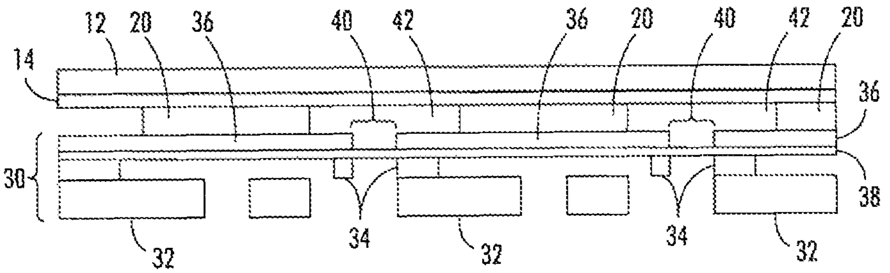
FIGS. 3-11 are cross sections depicting the formation of a jet stack for an ink jet print head.

After forming the individual piezoelectric elements 20, the FIG. 2 assembly can be attached to a jet stack subassembly 30 as depicted in the cross section of FIG. 3. The FIG. 3 cross section is magnified from the FIG. 2 structure for improved detail, and depicts cross sections of one partial and two complete piezoelectric elements 20. The jet stack subassembly 30 can be manufactured using known techniques. The jet stack subassembly 30 can include, for example, an inlet/outlet plate 32, a body plate 34, and a diaphragm 36 which is attached to the body plate 34 using an adhesive diaphragm attach material 38. The diaphragm 36 can include a plurality of openings 40 formed therein for the passage of ink in the completed device as described below. The FIG. 3 structure further includes a plurality of voids 42 which, at this point in the process, can be filed with ambient air. The diaphragm attach material 38 can be a solid sheet of material such as a single sheet polymer so that the openings 40 through the diaphragm 36 are covered.

Figure 4:
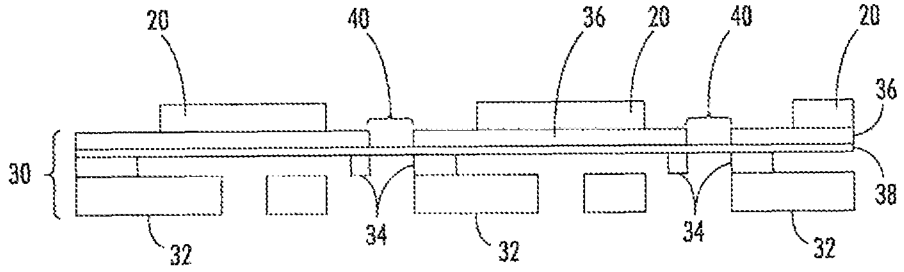

In an embodiment, the FIG. 2 structure can be attached to the jet stack subassembly 30 using an adhesive between the diaphragm 36 and the piezoelectric elements 20. For example, a measured quantity of adhesive (not individually depicted) can be dispensed, screen printed, rolled, etc., onto either the upper surface of the piezoelectric elements 20, onto the diaphragm 36, or both. In an embodiment, a single drop of adhesive can be placed onto the diaphragm for each individual piezoelectric element 20. After applying the adhesive, the jet stack subassembly 30 and the piezoelectric elements 20 are aligned with each other, then the piezoelectric elements 20 are mechanically connected to the diaphragm 36 with the adhesive. The adhesive is cured by techniques appropriate for the adhesive to result in the FIG. 3 structure. Subsequently, the transfer carrier 12 and the adhesive 14 are removed from the FIG. 3 structure to result in the structure of FIG. 4.

Figure 5:
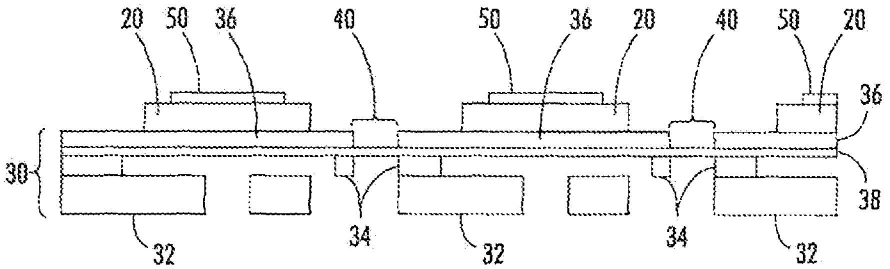

Next, quantity of conductor 50 is applied to a top surface of each piezoelectric element 20 as depicted in FIG. 5. The conductor 50 can be a conductive paste, a metal, a metal alloy, a conductive epoxy, or another conductor, and can be dispensed by any suitable techniques such as by screen printing, drop application, spraying, sputtering, chemical vapor deposition, etc. In some embodiments, a patterned mask (not depicted) can be used in conjunction with the formation of the conductor 50 to provide a patterned conductor 50.

Figure 6:
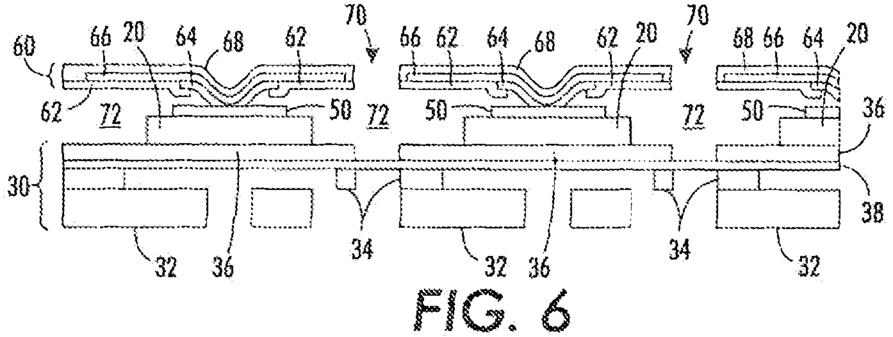

Subsequently, a flex circuit 60 is electrically coupled to the plurality of piezoelectric elements 20 using the conductor 50 as depicted in FIG. 6. The flex circuit 60 can include a first dielectric layer 62, a plurality of conductive bump electrodes 64 provided by a first conductive layer which can be a plating material, a plurality of conductive traces 66 provided by a second conductor layer, for example copper, and a second dielectric layer 68, for example Kapton® or another polyimide. It will be realized that other flex circuit designs can be used, for example which include a single conductor layer such as copper which forms bumps 64 and traces 66 rather than the multilevel metal configuration depicted. Additionally, various metal plating layers can be used to enhance conduction or for other purposes, such as nickel, gold, etc. Further, during formation of the flex circuit, the last layer applied may be the first dielectric layer 62, which can function as a solder mask, which can be applied by silkscreen, as a dry film, a photoimageable layer, or other methods. Thus the naming convention used herein for the flex circuit is not intended to imply a particular layer formation order. The flex circuit 60 can further include one or more optional openings 70, which can be defined during formation of the flex circuit 60, or formed after connection to the piezoelectric elements 20, for example using laser ablation. Subsequent to attachment of the flex circuit 60 to the piezoelectric elements 20, one continuous space, or a plurality of individual spaces 72 remain between the flex circuit 60 and the jet stack subassembly 30. In this embodiment, at this point in the process the space 72 can be filled with a gas such as ambient air.

In an embodiment, the plurality of conductive bump electrodes 64 and the plurality of conductive traces 66 can be provided by a single conductive layer, which can be formed as a planar layer then punched or stamped to shape using a press to form the contoured conductive bump electrodes. In the embodiment depicted, each trace 66 is electrically connected to one of the conductive bump electrodes 64 through conductive surface contact, and each conductive bump electrode 62 is electrically connected to one of the piezoelectric electrodes 20 using the conductor 50.

The bump electrodes 64 can be formed, for example, using the methods discussed in commonly assigned U.S. patent application Ser. No. 12/795,605, filed Jun. 7, 2010, which is incorporated herein by reference in its entirety. In an embodiment, the bump electrodes 64 of the flex circuit 60 can be formed using a stamping fixture which shapes the first conductive layer into the plurality of bump electrodes 64 after the first conductive layer has been formed on the first dielectric layer 62. It will be understood that other flex circuit 60 designs would function sufficiently with embodiments of the present teachings.

To form the assembly of FIG. 6, the bump electrodes 64 can be placed into the liquid conductor 50 subsequent to conductor deposition using a fixture which secures the bump electrodes 64 in physical contact with the piezoelectric elements 20, or at least in physical contact with the conductor 50. While holding the bump electrodes 64 in contact with the conductor 50, the conductor 50 can be cured using an appropriate technique. When using a conductive paste or epoxy, the conductor 50 can be cured by heating to remove volatile solvents and to physically and electrically attach the flex circuit 60 to the piezoelectric elements 20. A conductive epoxy, for example, can be snap cured by elevating the temperature of the conductive epoxy to between about 140° C. and about 160° C., for example about 150° C., for a duration of between about 30 seconds and about 2 minutes, for example for about 1 minute. When using a solder as a conductor, the solder can be cooled to cure the conductor 50.

In an embodiment, the conductor 50 can be a metal solder, such as a tin-lead solder, which is applied in liquid form to the piezoelectric elements 20: The bump electrodes 64 can be contacted to the solder 50 prior to cooling, then the solder can be cooled to physically and electrically connect the flex circuit 60 to the jet stack subassembly 30. In another embodiment, solder can be dispensed onto the piezoelectric elements 20 and then cooled. After cooling, the bump electrodes 64 can be placed in physical contact with the solid solder 50, then the solid solder 50 and the bump electrodes 64 can be heated to reflow the solder 50. After reflow, the solder and bump electrodes 64 can be cooled to physically and electrically connect the flex circuit 60 to the plurality of piezoelectric elements 20, and to physically attach the flex circuit 60 to the jet stack subassembly 30.

In an embodiment, a process can include dispensing the conductor onto the plurality of bump electrodes 64. The conductor-coated bump electrodes 64 can be placed in physical contact with the plurality of piezoelectric elements 20, the conductor can be reflowed and then cooled, or heated to remove volatile solvents, to attach the flex circuit 60 to the piezoelectric elements 20 and to the jet stack subassembly 30.

In contrast to some conventional processes, the conductor of the present teachings is not forced laterally away from the surface of the piezoelectric elements 20. A liquid conductor can wick vertically along the surface of the bump electrode 64, thereby preventing its flow away from the desired location. This can result from the protrusion of the bump electrodes from the lower surface of the dielectric layer. In an embodiment, the lower surface of the bump electrode can protrude from the lower surface of the first dielectric layer by a distance of between about 10 μm and about 100 μm, or between about 25 μm and about 100 μm, or between about 50 μm and about 75 μm. The bump electrodes should protrude from the first dielectric layer by a distance sufficient to ensure electrical contact with each piezoelectric element after clearing any intervening structures such as a solder mask. When using a conductive paste as conductor 50, the space 72 is sufficiently large that excessive paste can remain over the surface of the piezoelectric element 20 and around the bump electrode 64 without being forced off the top of the piezoelectric element, which could create an electrical shorts to an adjacent bump electrode 64 or to an adjacent transducer 20.

Figure 7:
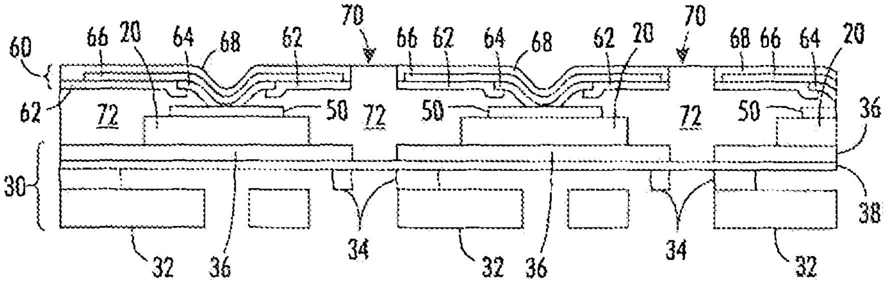
Figure 8:
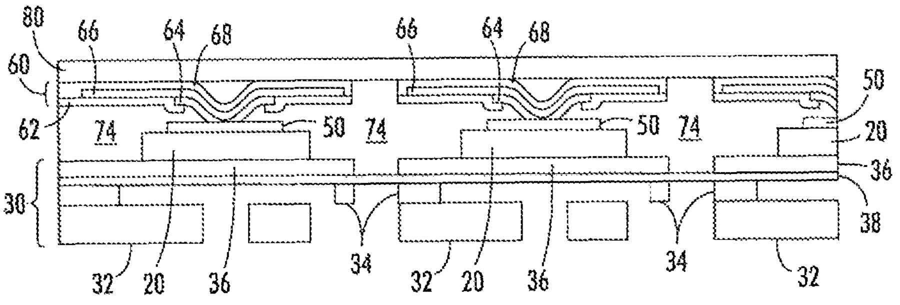

After electrically coupling the flex circuit 60 to the plurality of piezoelectric elements 20, a dielectric underfill 74 can dispensed into the space 72 between the flex circuit 60 and the jet stack subassembly 30 as depicted in FIG. 7. The underfill 74 can be forced under pressure into the space 72 through the optional openings 70 in the flex circuit 60. In another embodiment, the flex circuit 60 does not include optional openings 70, but the dielectric underfill 74 is dispensed into the space 72 at an edge of the piezoelectric element array using capillary flow (capillarity) to draw the liquid underfill 74 between the flex circuit 60 and the jet stack subassembly 30. In another embodiment, a vacuum is placed on the optional openings 70 through the flex circuit, and the underfill 74 is dispensed into the space 72 at an edge of the piezoelectric element array using the vacuum to draw the liquid underfill into the space 72. The vacuum can improve the flow of liquid underfill 74 into the space 72. During dispensing of the underfill, the diaphragm attach material 38 covers the openings 40 and prevents the underfill 74 from flowing into the openings 40.

In an embodiment, the liquid underfill can be a dielectric polymer, for example a combination of Epon™ 828 epoxy resin (100 parts by weight) available from Miller-Stephenson Chemical Co. of Danbury, Conn., and Epikure™ 3277 curing agent (49 parts by weight) available from Hexion Specialty Chemicals of Columbus, Ohio. A sufficient quantity of uncured interstitial layer can be dispensed into the space 72 to fill the space 72 and to result in the structure of FIG. 7. After filling the space 72, the underfill 74 can be cured using an appropriate technique, for example by heating or exposing the underfill to an ultraviolet light from a light source.

The jet stack subassembly depicted in FIG. 7 includes a conductive pathway from each piezoelectric element 20, to the conductor 50, to the bump electrodes 64, and to the traces 66. The traces 66 can each be routed to a location where it will receive a digital signal, such that each piezoelectric element is individually addressable and can be actuated independently of the other piezoelectric elements. The plurality of traces 66 are thus adapted to provide an individual digital signal a respective piezoelectric element 20 connected thereto, such that each piezoelectric element 20 can be individually addressed and activated.

Next, additional processing can be performed, depending on the design of the device. The additional processing can include, for example, the formation of on or more additional layers which can be conductive, dielectric, patterned, or continuous, and which are represented by layer 80.

Figure 9:
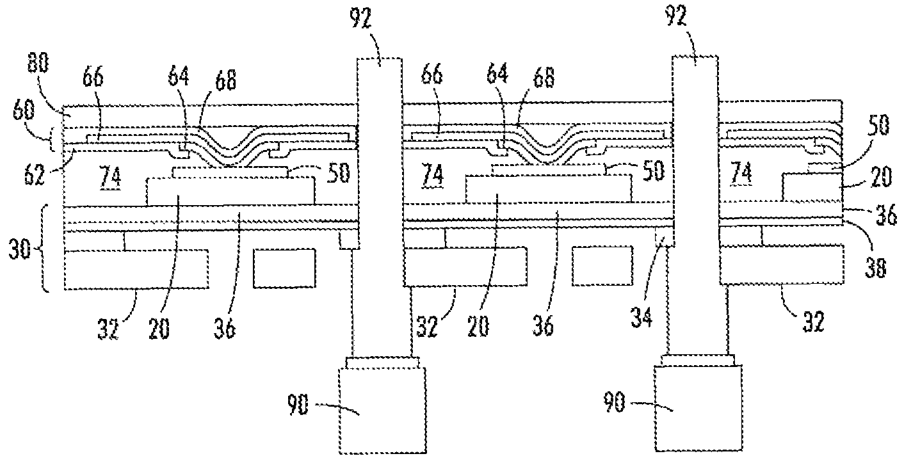
Figure 10:
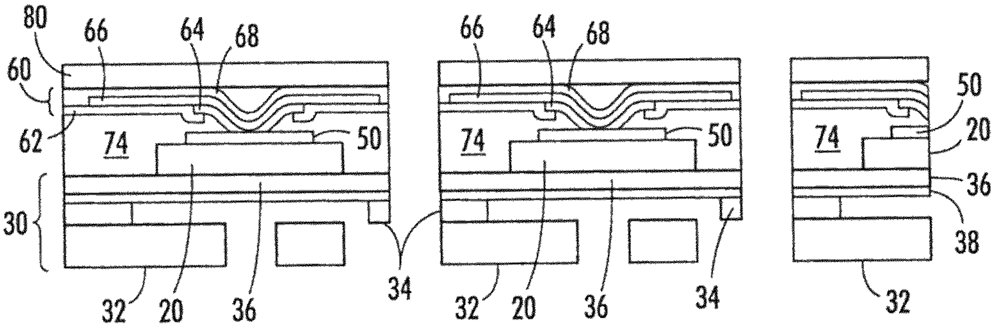

Next, the openings 40 through the diaphragm 36 can be cleared to allow passage of ink through the diaphragm 36. Clearing the openings 40 includes removing a portion of the adhesive diaphragm attach material 38, the dielectric underfill 74, and any additional overlying layer 80. Additionally, a portion of one or more traces 66 can be removed, as long as it does not result in undesirable electrical characteristics such as an electrical open. In various embodiments, chemical or mechanical removal techniques can be used. In an embodiment, a self-aligned removal process can include the use of a laser 90 outputting a laser beam 92 as depicted in FIG. 9, particularly where the inlet/outlet plate 32, the body plate 34, and the diaphragm 36 are formed from metal. The inlet/outlet plate 32, the body plate 34 and optionally, depending on the design, the diaphragm 36 can mask the laser beam 92 for a self-aligned laser ablation process. In this embodiment, a laser such as a $CO_2$ laser, an excimer laser, a solid state laser, a copper vapor laser, and a fiber laser can be used. A $CO_2$ laser and an excimer laser can typically ablate polymers including epoxies. A $CO_2$ laser can have a low operating cost and a high manufacturing throughput. While two lasers 90 are depicted in FIG. 9, a single laser beam can open each hole in sequence using one or more laser pulses. In another embodiment, two or more openings can be made in a single operation. For example, a mask can be applied to the surface then a single wide single laser beam could open two or more openings, or all of the openings, using one or more pulses from a single wide laser beam. A $CO_2$ laser beam that can over-fill the mask provided by the inlet/outlet plate 32, the body plate 34, and possibly the diaphragm 36 could sequentially illuminate each opening 40 to form the extended openings through the adhesive diaphragm attach material 38, the dielectric underfill 74, and any additional layers 80 as depicted in FIG. 9 to result in the FIG. 10 structure.

Figure 11:
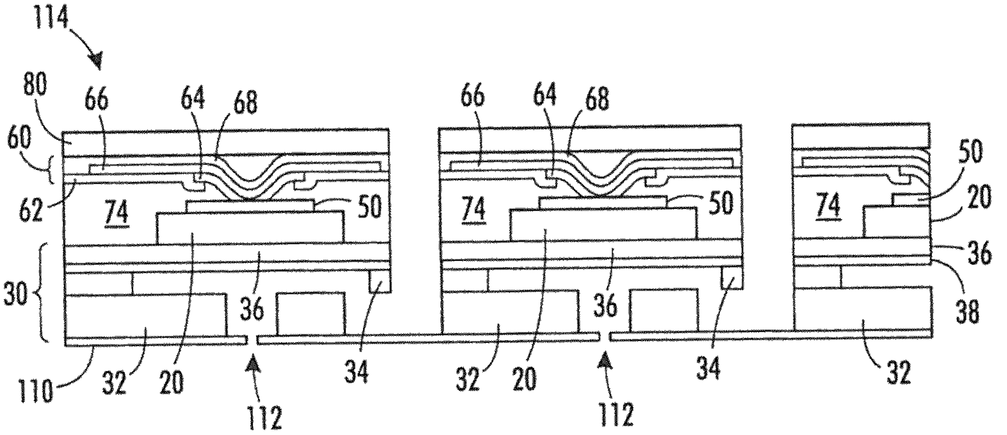

Subsequently, an aperture plate 110 can be attached to the inlet/outlet plate 32 with an adhesive (not individually depicted) as depicted in FIG. 11. The aperture plate 110 includes nozzles 112 through which ink is expelled during printing. Once the aperture plate 110 is attached, the jet stack 114 is complete. A jet stack 114 can include other layers and processing requirements not depicted or described for simplicity.

Figure 12:
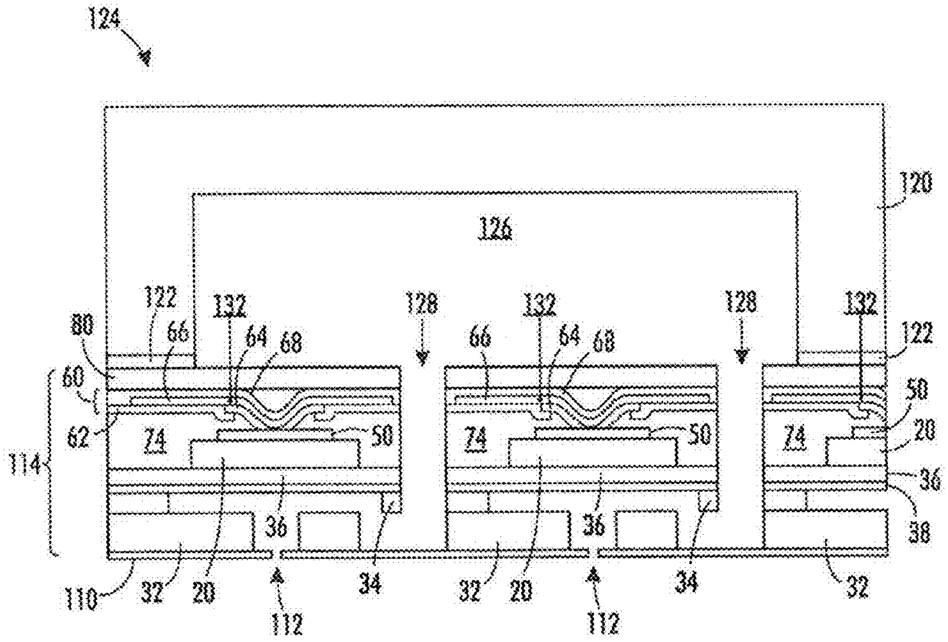
FIG. 12 is a cross section of a print head including the jet stack of FIG. 11.

Next, a manifold 120 can be bonded to the upper surface of the jet stack 114, for example using a fluid-tight sealed connection 122 such as an adhesive to result in an ink jet print head 124 as depicted in FIG. 12. The ink jet print head 124 can include an ink reservoir 126 formed by a surface of the manifold 120 and the upper surface of the jet stack 114 for storing a volume of ink. Ink from the reservoir 126 is delivered through ports 128 in the jet stack 114, wherein the ink ports are provided, in part, by a continuous opening through the flex circuit 60, the underfill 74, the diaphragm 36, and the diaphragm attach material 38. It will be understood that FIG. 12 is a simplified view. An actual print head may include various structures and differences not depicted in FIG. 12, for example additional structures to the left and right, which have not been depicted for simplicity of explanation. While FIG. 12 depicts two ports 128, a typical jet stack can have, for example, a 344×20 array of ports.

In use, the reservoir 126 in the manifold 120 of the print head 124 includes a volume of ink. An initial priming of the print head can be employed to cause ink to flow from the reservoir 126, through the ports 128 in the jet stack 114, and into chambers 130 in the jet stack 114. Responsive to a voltage 132 placed on each trace 66 which is transferred to the bump electrodes 64, to the conductor 50, and to the piezoelectric electrodes 20, each PZT piezoelectric element 20 vibrates at an appropriate time in response to a digital signal placed on the trace 66, wherein the trace 66 is electrically coupled to the piezoelectric element 20 through a bump electrode 64 and conductor 50. The deflection of the piezoelectric element 20 causes the diaphragm 36 to flex which creates a pressure pulse within the chamber 130, causing a drop of ink to be expelled from the nozzle 112.

The methods and structure described above thereby form a jet stack 114 for an ink jet printer. In an embodiment, the jet stack 114 can be used as part of an ink jet print head 124 as depicted in FIG. 12.

Figure 13:
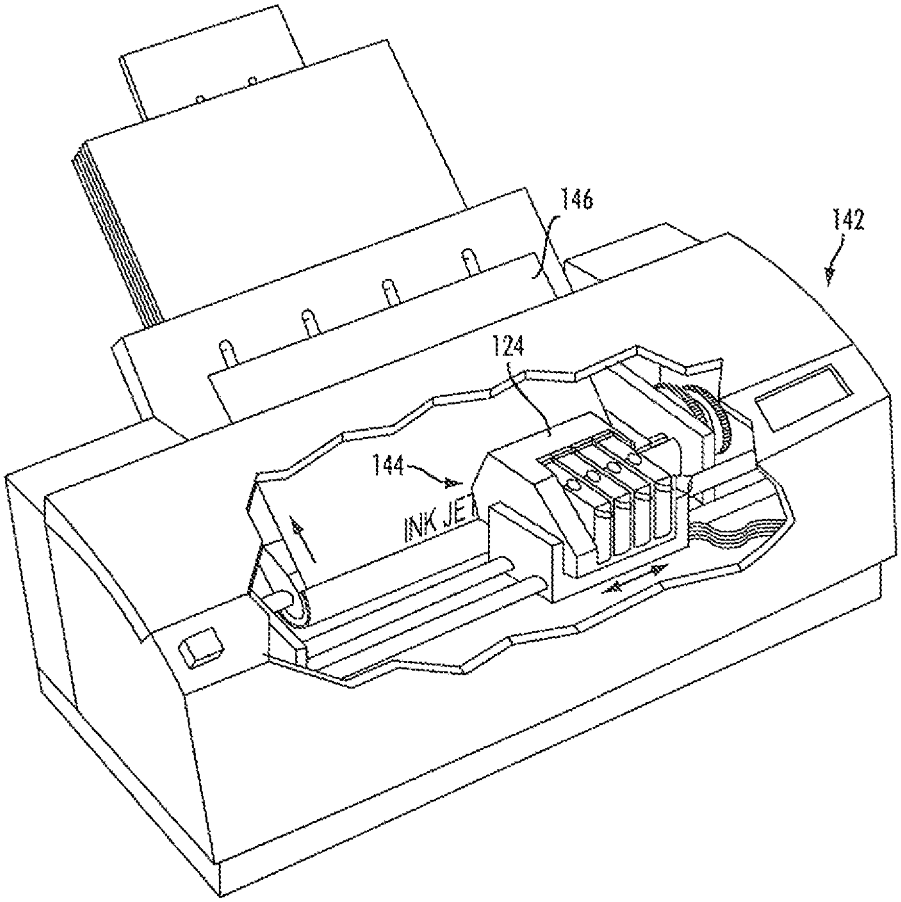
FIG. 13 is a printing device including a print head according to an embodiment of the present teachings.

FIG. 13 depicts a printer 142 including one or more print heads 124 and ink 144 being ejected from one or more nozzles 112 in accordance with an embodiment of the present teachings. Each print head 124 is adapted to operate in accordance with digital instructions to create a desired image on a print medium 146 such as a paper sheet, plastic, etc. Each print head 124 may move back and forth relative to the print medium 146 in a scanning motion to generate the printed image swath by swath. Alternately, the print head 124 may be held fixed and the print medium 146 moved relative to it, creating an image as wide as the print head 124 in a single pass. The print head 124 can be narrower than, or as wide as, the print medium 146.

The embodiment described above can thus provide a jet stack for an ink jet print head which can be used in a printer. The method for forming the jet stack, and the completed jet stack, does not require the use of a standoff layer to contain the flow of conductor which electrically couples an electrode or other conductive element to a piezoelectric element. Eliminating the standoff layer reduces material costs. Additionally, the method does not require the removal of an interstitial layer from the top of each piezoelectric element, as the embodiments described above form the interstitial layer as an underfill layer after attaching the flex circuit. Further, because there is no standoff layer during attachment of the flex circuit to the piezoelectric elements, electrical shorting is reduced. The conductor can wick to the surface of the bump electrodes or be cured prior to forming the underfill so that excessive conductor remains near the desired location without electrical shorting to adjacent bump electrodes or piezoelectric elements. This is in contrast to conventional designs in which the conductor can be forced under the standoff layer during attachment of the printed circuit board which can result in electrical shorting. The present teachings can reduce the number of components, materials, and assembly stages compared to some prior processes. Yields can improve through elimination of current failure modes, such as short circuits. By simplifying the material set, compatibility with ink and other environmental materials typical of ink jet print heads can be improved. Further, embodiments can eliminate the requirement of some conventional processes to planarize the upper surface of an interstitial layer to allow connection of a standoff layer. Also, the removal of an interstitial layer from the top surface of the piezoelectric elements using chemical or mechanical etching is not required. Using an underfill process in accordance with present embodiments planarizes the dielectric underfill in situ through physical contact with the flex circuit.

Figure 14:
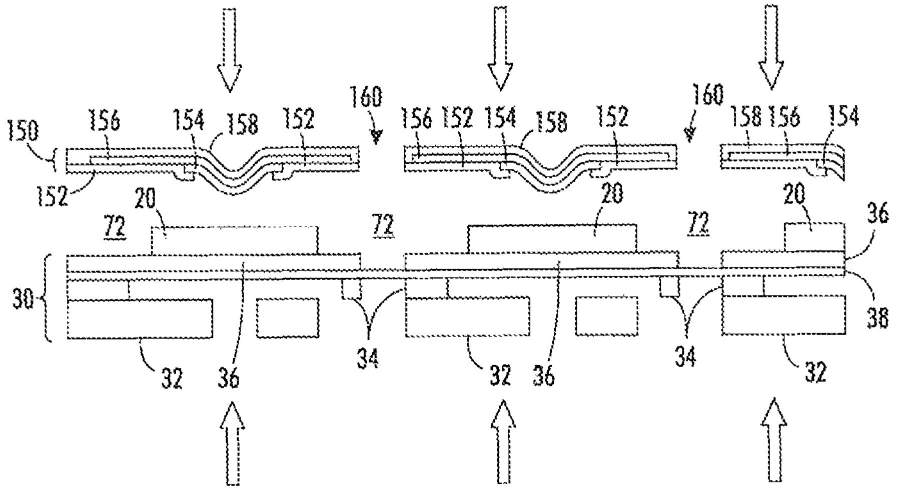
FIGS. 14-17 are cross sections depicting the formulation of a jet stack for an ink jet print head according to another embodiment of the present teachings.
Figure 15A:
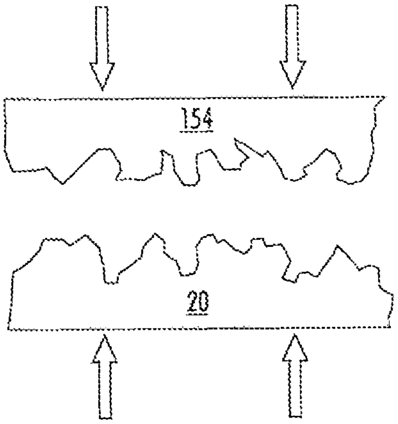
Figure 15B:
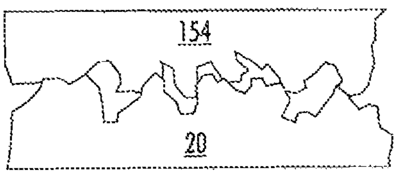
Figure 16:
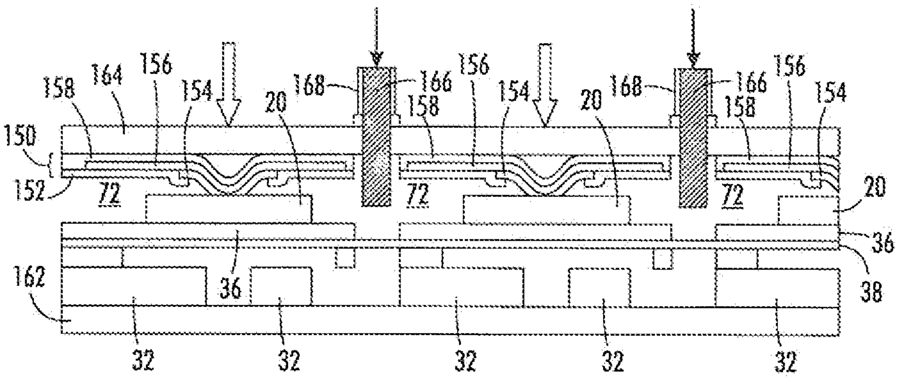

Another embodiment of the present teachings is depicted in FIGS. 14-16. This embodiment can start with a structure similar to that depicted in FIG. 4. The piezoelectric element 20 has a rough surface texture comprising a plurality of surface asperities. For example, a nickel plated PZT ceramic can have a surface roughness on the order of about 2 μm.

A flex circuit 60 similar to that depicted in FIG. 6 can be formed, and is depicted in FIG. 14 as flex circuit 150. The flex circuit 150 can include a first dielectric layer 152, a first conductive layer which forms a plurality of bump electrodes 154, a second conductor layer which forms a plurality of traces 156, and a second dielectric layer 158. The flex circuit 150 can further include a plurality of optional openings therein 160, which can be formed according to the embodiment of the present teachings which is described above.

In this embodiment, the plurality of bump electrodes 154 can be formed to have a plurality of surface asperities. The asperities on the plurality of bump electrodes 154 can be formed as a natural surface roughness of the material or materials from which the bump electrodes 154 are formed, and can have an average height from less than 1.0 μm to about 3.0 μm. A magnified view of one piezoelectric element 20 and one bump electrode 154 is depicted in the magnified cross section of FIGS. 15A and 15B. In this embodiment, no additional conductor is interposed between the bump electrodes 154 and the piezoelectric element 20. Physical contact between the surface asperities on the bump electrodes 154 and the surface asperities on the piezoelectric elements 20 is relied on to provide electrical coupling and establish electrical communication between the bump electrodes 154 and the piezoelectric elements 20. That is, conductive paths between the plurality of bump electrodes 154 and the plurality of piezoelectric elements 20 is provided through direct physical contact between the two structures.

As depicted in FIG. 14, the flex circuit 150 is aligned with the jet stack subassembly 30. Particularly, the flex circuit bump electrodes 154 are aligned with the piezoelectric elements 20. Either the flex circuit 150 or the jet stack 30 (or both) is moved toward the other as depicted in FIGS. 14 and 15A. The plurality of bump electrodes 154 are brought into contact with the plurality of piezoelectric elements 20 as depicted in FIG. 15B. Direct physical contact results in electrical contact between the conductive bump electrodes 154 and the conductive piezoelectric elements 20. In an embodiment, a force of between about 50 lbs/in$^2$ (psi) and about 300 psi, or between about 50 psi and about 250 psi, or between about 100 psi and about 200 psi (inclusive) can be applied between the flex circuit 150 and the jet stack subassembly 30. The applied force should be sufficiently high to prevent lifting of the bump electrodes 154 away from the piezoelectric elements 20 during injection of the dielectric underfill 166, but not so high as to damage or deform the piezoelectric elements 20 or flex circuit 150 during force application.

In an embodiment, a press can be used to facilitate contact between the flex circuit 150 and the piezoelectric elements 20 as depicted in FIG. 16. FIG. 16 depicts a press which can be used to cause physical contact between the bump electrodes 154 and the piezoelectric elements 20. The press can also be used to hold the plurality of bump electrodes 154 in physical contact with the plurality of piezoelectric elements 20 during an underflow process.

During the underflow process, the jet stack 30 can rest on a first press surface 162 while a second press surface 164 forces the flex circuit 150 against the piezoelectric elements 20 to maintain physical and electrical contact between the plurality of bump electrodes 154 and the plurality of piezoelectric elements 20. While forcing the flex circuit 150 against the piezoelectric elements 20 using the application of pressure, a liquid underfill 166 can be dispensed into the space 72 between the flex circuit 150 and the jet stack 30. The underfill can be pumped under pressure through one or more tubes 168 through the second press surface 164 and through the openings 160 through the flex circuit 150. In another embodiment, the underfill 166 can be applied at the edge of the piezoelectric array and drawn into the space 72 through capillarity or through a vacuum applied to the openings 160. While the press holds the bump electrodes 154 in pressure contact with the piezoelectric elements 20, a sufficient quantity of liquid underfill can be pumped into the space 72 to fill the space and to encapsulate the plurality of piezoelectric elements 20 within the underfill 166. Optionally, one or both press plates 162, 164 and/or the dispense tubes 168 can be heated, for example to a temperature of between about 70° C. and about 100° C. as the liquid underfill 166 is pumped into the space 72. Heating the press plates 162, 164 and/or the dispense tubes 168 may aid or enable capillary action of the underfill material into space 72, for example by transferring heat to the underfill 166 and decreasing viscosity of the underfill 166 as it is being dispensed into space 72. After filling the space 72 with underfill 166, the underfill 166 is cured. Curing the underfill 166 adheres the flex circuit 150 to the jet stack 30, at which point the pressure contact provided by the press can be released. The underfill 166 functions as an adhesive through contact with the lower surface of the first dielectric layer 152, the plurality of piezoelectric elements 20, the diaphragm 36, and the bump electrodes 154 to maintain physical and electrical contact between the plurality of bump electrodes 154 and the plurality of piezoelectric elements 20.

Figure 17:
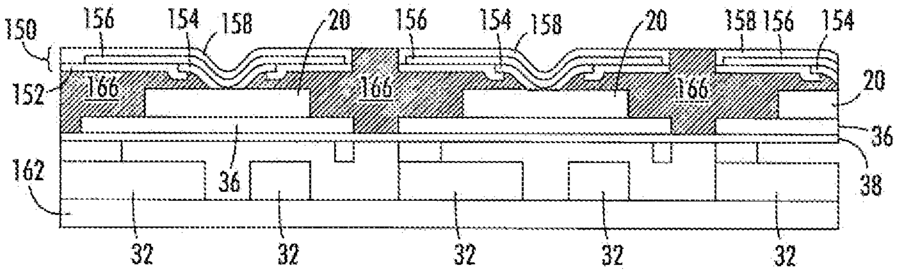

Subsequently, after filling the space 72 with underfill 166, curing the underfill 166, and removing the structure from the press, a structure similar to that depicted in FIG. 17 remains. Processing can continue according to the processing of the FIG. 7 structure to form a completed jet stack, a print head, and a printer.

To determine the efficacy of the embodiment described with reference to FIGS. 14-17, device testing was performed. FIGS. 18A and 18B show contact resistance data for a print head piezoelectric element array (transducer array) formed using a method similar to that described with reference to FIGS. 14-16. The resistance was measured for each of 126 connections between 126 bump electrodes of a flex circuit and 126 piezoelectric elements. Pass criteria for this method was set at a maximum of 100 ohms (Ω), such that any connection which exhibited a resistance of 100Ω or less was considered acceptable. FIG. 18A shows the resistance data immediately after formation of the structure. FIG. 18B shows the resistance data of the same structure after 3841 temperature cycles from room temperature to 120° C. and back to room temperature, using a temperature ramp of approximately 40° C./minute.

Figure 19:
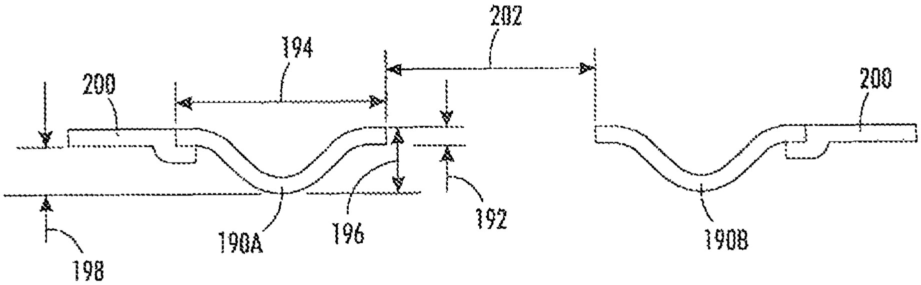
FIG. 19 is a schematic cross section depicting two bump electrodes according to an embodiment of the present teachings.

FIG. 19 is a schematic cross section depicting two bump electrodes 190A, 190B, with various tolerances according to an embodiment of the present teachings. It will be understood that FIG. 19 is used to illustrate dimensions of various structures for an embodiment of the present teachings, while other structures may be present but are not depicted for simplicity of explanation. FIG. 19 is not meant to represent a completed structure. A thickness 192 of each bump electrode 190 can be between about 1 μm and about 25 μm, or between about 5 μm and about 11 μm, for example about 8 μm. A width 194 of each bump electrode can be between about 50 μm and about 500 μm, or between about 200 μm and about 400 μm, or between about 250 μm and about 350 μm, for example about 300 μm. Each bump electrode 190 can have a height 196 of between about 25 μm and about 75 μm, or between about 12 μm and about 50 μm. Excessive height may crack or perforate the flex circuit. The first dielectric layer 200 can have a thickness of between about 10 μm to about 75 μm, or from about 10 μm to about 50 μm. A distance 198 from a lower surface of the first dielectric layer 200 of the flex circuit to the nadir of each bump electrode 190 can be between about 5 μm and about 50 μm, or between about 5 μm and about 25 μm, for example about 25 μm. Distance 198 can be a function of the thickness of the first dielectric layer 200. A distance 202 between adjacent bump electrodes 190A, 190B can be between about 50 μm and about 1000 μm, or between about 300 μm and about 500 μm. Higher density devices will have a distance 202 toward the low side of the range.

In another embodiment, the two bump electrodes 190A, 190B can be formed from a continuous conductive layer which provides, for example, both the bump electrodes 64 and the traces 66 of the FIG. 6 embodiment, such that a second conductor layer 66 is not required. The single conductive layer can therefore provide continuous electrical traces and bump electrodes, wherein electrical signals are routed through the traces and bump electrodes to individually address and actuate each piezoelectric element.

It will be appreciated that these values are exemplary and will vary depending on the design of the particular device being produced, and do not limit the scope of the present teachings.

This embodiment thus eliminates the requirement for a dielectric patterned standoff, as well as the requirement for a separate electrical conductor to connect the piezoelectric elements to a printed circuit board. Conductors such as epoxy filled with silver or other precious metals are expensive, as are patterned standoffs; additionally, their incorporation into the process adds processing costs, complexity, and time. Eliminating the conductor removes the possibility of electrical shorts resulting from the conductor, which can result from silver-filled epoxy flowing into unwanted areas and creating shorts. Further, a conventional interstitial material between each piezoelectric element is not required which, according to some conventional techniques, must be patterned to remove it from the tops of the piezoelectric elements so that subsequent electrical connection can be made. By simplifying material sets, compatibility with ink and other environmental materials typical of ink jet print heads can be improved.

These types of interconnects described herein can also be applied to other high density array structures such as image input scanners and a multitude of other sensors or transducers.

Note that while the exemplary method is illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the present teachings. In addition, not all illustrated steps may be required to implement a methodology in accordance with the present teachings. Other embodiments will become apparent to one of ordinary skill in the art from reference to the description and FIGS. herein.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method for forming an ink jet print head, comprising:
attaching a piezoelectric element array comprising a plurality of piezoelectric elements to a diaphragm;
electrically coupling a plurality of electrically conductive flexible printed circuit electrodes of a flexible printed circuit to the plurality of electrically conductive piezoelectric elements to form at least one space between the diaphragm and the flexible printed circuit, wherein the flexible printed circuit comprises a plurality of openings therethrough;
applying a vacuum to the plurality of openings through the flexible printed circuit;
dispensing a liquid underfill into the at least one space between the diaphragm and the flexible printed circuit at an edge of the piezoelectric element array using the vacuum placed on the plurality of openings through the flexible printed circuit to draw the liquid underfill into the at least one space between the diaphragm and the flexible printed circuit; and
curing the liquid underfill to encapsulate the plurality of piezoelectric elements within the underfill.

2. The method of claim 1, further comprising:
forming a flex circuit dielectric layer; and
forming the plurality of conductive electrodes into a plurality of bump electrodes which protrude from a lower surface of the flexible printed circuit dielectric layer.

3. The method of claim 2, further comprising:
forming the plurality of conductive bump electrodes to protrude from the lower surface of the flexible printed circuit by a distance of between about 10 μm and about 100 μm.

4. The method of claim 3, further comprising:
attaching the flexible printed circuit to the diaphragm using the underfill as an adhesive.

5. The method of claim 1, further comprising:
placing a conductor on the plurality of piezoelectric elements;
contacting the conductor with the plurality of flexible printed circuit electrodes; and
curing the conductor to electrically couple the plurality of flexible printed circuit electrodes to the plurality of piezoelectric elements.

6. The method of claim 1, further comprising:
forming the plurality of piezoelectric elements to each have a plurality of surface asperities;
forming the plurality of flexible printed circuit electrodes to each have a plurality of surface asperities;
contacting the plurality of flexible printed circuit electrodes with the plurality of piezoelectric elements to establish electrical communication between the plurality of flexible printed circuit electrodes and the plurality of piezoelectric elements through direct physical contact;
while holding the plurality of flexible printed circuit electrodes in pressure contact with the plurality of piezoelectric elements, dispensing the underfill between the at least one space between the flexible printed circuit and the diaphragm; and
subsequent to curing the liquid underfill, releasing the pressure contact.

7. The method of claim 1, further comprising:
forming a plurality of openings in the diaphragm;
attaching a body plate to the diaphragm using a diaphragm attach material;
preventing the underfill from flowing into the openings in the diaphragm using the diaphragm attach material; and
subsequent to curing the underfill, clearing the underfill from the plurality of openings in the diaphragm.

8. The method of claim 7, further comprising:
laser ablating the diaphragm attach material, the underfill, and the flexible printed circuit to clear the plurality of openings in the diaphragm.

9. A method for forming an ink jet print head, comprising:
attaching a piezoelectric element array comprising a plurality of piezoelectric elements to a diaphragm, the diaphragm comprising a plurality of openings therein;
attaching a body plate to the diaphragm using a diaphragm attach material;
electrically coupling a plurality of electrically conductive flexible printed circuit electrodes of a flexible printed circuit to the plurality of electrically conductive piezoelectric elements to form at least one space between the diaphragm and the flexible printed circuit;
dispensing a liquid underfill into the at least one space between the diaphragm and the flexible printed circuit, and preventing the underfill from flowing into the plurality of openings using the diaphragm attach material; and
curing the liquid underfill to encapsulate the plurality of piezoelectric elements within the underfill; and
subsequent to curing the underfill, clearing the underfill from the plurality of openings in the diaphragm.

10. The method of claim 9, further comprising:

laser ablating the diaphragm attach material, the underfill, and the flexible printed circuit to clear the plurality of openings in the diaphragm.

11. The method of claim 9, further comprising:

forming a flex circuit dielectric layer; and forming the plurality of conductive electrodes into a plurality of bump electrodes which protrude from a lower surface of the flexible printed circuit dielectric layer.

12. The method of claim 11, further comprising:

forming the plurality of conductive bump electrodes to protrude from the lower surface of the flexible printed circuit by a distance of between about 10 μm and about 100 μm.

13. The method of claim 12, further comprising:

attaching the flexible printed circuit to the diaphragm using the underfill as an adhesive.

14. The method of claim 9, further comprising:

placing a conductor on the plurality of piezoelectric elements;

contacting the conductor with the plurality of flexible printed circuit electrodes; and curing the conductor to electrically couple the plurality of flexible printed circuit electrodes to the plurality of piezoelectric elements.

15. The method of claim 9, further comprising:

forming the plurality of piezoelectric elements to each have a plurality of surface asperities;

forming the plurality of flexible printed circuit electrodes to each have a plurality of surface asperities;

contacting the plurality of flexible printed circuit electrodes with the plurality of piezoelectric elements to establish electrical communication between the plurality of flexible printed circuit electrodes and the plurality of piezoelectric elements through direct physical contact;

while holding the plurality of flexible printed circuit electrodes in pressure contact with the plurality of piezoelectric elements, dispensing the underfill between the at least one space between the flexible printed circuit and the diaphragm; and subsequent to curing the liquid underfill, releasing the pressure contact.

* * * * *